US012603620B2

(12) United States Patent
Mizoshiri et al.

(10) Patent No.: US 12,603,620 B2
(45) Date of Patent: Apr. 14, 2026

(54) CLASS-D AMPLIFIER

(71) Applicant: Yamaha Corporation, Hamamatsu (JP)

(72) Inventors: Shinya Mizoshiri, Hamamatsu (JP);
Masao Noro, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 448 days.

(21) Appl. No.: 18/126,751

(22) Filed: Mar. 27, 2023

(65) Prior Publication Data

US 2023/0261619 A1　Aug. 17, 2023

Related U.S. Application Data

(63) Continuation of application No. PCT/JP2021/034128, filed on Sep. 16, 2021.

(30) Foreign Application Priority Data

Sep. 28, 2020　(JP) ................................. 2020-161667

(51) Int. Cl.
*H03F 3/217*　(2006.01)
(52) U.S. Cl.
CPC ....... *H03F 3/217* (2013.01); *H03F 2200/351* (2013.01)
(58) Field of Classification Search
None
See application file for complete search history.

(56) References Cited

U.S. PATENT DOCUMENTS 10,587,232 B2 * 3/2020 Lesso ................... H03F 3/2173

FOREIGN PATENT DOCUMENTS

| JP | 2003-46342 A | 2/2003 |
| JP | 2008-17353 A | 1/2008 |
| JP | 2018-137548 A | 8/2018 |

OTHER PUBLICATIONS

Japanese-language Office Action issued in Japanese Application No. 2020-161667 dated Sep. 10, 2024 with English translation (5 pages).
International Search Report (PCT/ISA/210) issued in PCT Application No. PCT/JP2021/034128 dated Dec. 14, 2021 with English translation (five (5) pages).
International Preliminary Report on Patentability (PCT/IB/338 & PCT/IB/373) issued in PCT Application No. PCT/JP2021/034128 dated Apr. 6, 2023, including Japanese-language Written Opinion (PCT/ISA/237) with English translation (eight (8) pages).

* cited by examiner

*Primary Examiner* — Andrea Lindgren Baltzell
*Assistant Examiner* — Malane Lieng
(74) *Attorney, Agent, or Firm* — Crowell & Moring LLP

(57) ABSTRACT

A class-D amplifier that amplifies an input signal comprises a control circuit configured to generate a control signal that varies in accordance with a level of the input signal, a first generating circuit configured to generate a first pulse, and a second generating circuit configured to generate a second pulse. A pulse width of the first pulse becomes narrower as the signal level of the input signal becomes smaller, and the pulse width of the first pulse becomes wider as an instantaneous magnitude of the input signal becomes larger. A pulse width of the second pulse becomes narrower as the signal level of the input signal becomes smaller, and the pulse width of the second pulse becomes wider as an instantaneous magnitude of the input signal becomes smaller.

13 Claims, 3 Drawing Sheets

FIG.5

CLASS-D AMPLIFIER

CROSS-REFERENCE TO RELATED APPLICATIONS

The present application is a continuation application of International Application No. PCT/JP2021/034128, filed on Sep. 16, 2021, which claims priority to Japanese Patent Application No. 2020-161667, filed on Sep. 28, 2020. The entire contents of these applications are incorporated herein in their entirety.

BACKGROUND ART

This disclosure relates to a class-D amplifier configured to drive a load by a pulse modulated by pulse width modulation based on an input signal.

There has been known a class-D amplifier configured to generate a first pulse and a second pulse, and drive a load such as a speaker by the first pulse and the second pulse. A width of the first pulse becomes wider in accordance with a variation of an input signal in a positive direction. A width of the second pulse becomes wider in accordance with a variation of the input signal in a negative direction. It is noted that "a signal" in the present disclosure indicates the signal itself or a voltage of the signal. A current of a signal is clearly described as "the current of the signal".

In a certain kind of a filter-less type class-D amplifier, an area of the input signal in which the first pulse is output and an area of the input signal in which the second pulse is output are overlapped with each other in a small-signal area in which an instantaneous magnitude of the input signal (the input voltage) is nearly zero.

In the small-signal area in which an absolute value of the input signal is small, the input signal remains between the lower limit of the input signal above which the first pulse can be generated and the upper limit of the input signal below which the second pulse can be generated. In the small-signal area, both the width of the first pulse and the width of the second pulse become narrow, and it is possible to reduce power consumption.

SUMMARY

In the above described conventional class-D amplifier, however, the first pulse whose width of the pulse becomes wider in accordance with the variation of an instantaneous magnitude of the input signal in the positive direction and the second pulse whose width of the pulse becomes narrower in accordance with the variation of the instantaneous magnitude of the input signal in the positive direction are outputted in the small-signal area. In a large-signal area other than the small-signal area, only one of the first pulse and the second pulse is outputted. As a result of this, the small-signal area is a high-gain area in which an open-loop gain of the class-D amplifier is high, and the large-signal area in which the absolute value of the input signal is large is a low-gain area in which the open-loop gain of the class-D amplifier is lower than that of the high gain area. Input-output characteristics of the large-signal area of the class-D amplifier are nonlinear and have a lot of total harmonic distortion.

Related to a technique of suppressing distortion of the output signal of the class-D amplifier, an offset voltage in accordance with the distortion occurred at the output stage of the class-D amplifier is given to the input signal of a pulse-width modulator of the class-D amplifier.

However, the distortion caused by the non-linear characteristics of the output stage of the above described conventional class-D amplifier cannot be suppressed even if the amount of shift (the amount of offset) of the input signal is adjusted.

An aspect of the disclosure relates to a class-D amplifier capable of suppressing deterioration of a total harmonics distortion rate and reducing power consumption in the small-signal area.

In one aspect of the disclosure, a class-D amplifier that amplifies an input signal comprises a control circuit configured to generate a control signal that varies in accordance with a level of the input signal, a first generating circuit configured to generate a first pulse, and a second generating circuit configured to generate a second pulse. A pulse width of the first pulse becomes narrower in accordance with the control signal as the signal level of the input signal becomes smaller, and the pulse width of the first pulse becomes wider in accordance with the control signal as an instantaneous magnitude of the input signal becomes larger. A pulse width of the second pulse becomes narrower in accordance with the control signal as the signal level of the input signal becomes smaller, and the pulse width of the second pulse becomes wider in accordance with the control signal as an instantaneous magnitude of the input signal becomes smaller.

The objects, features, advantages, and technical and industrial significance of the present disclosure will be better understood by reading the following detailed description of the embodiments, when considered in connection with the accompanying drawings.

BRIEF DESCRIPTION OF THE DRAWINGS

FIG. 5 is a diagram illustrating an example of operations of the class-D amplifier.

DETAILED DESCRIPTION

There will be described below an embodiment of the present disclosure with respect to the drawings.

Figure 1:
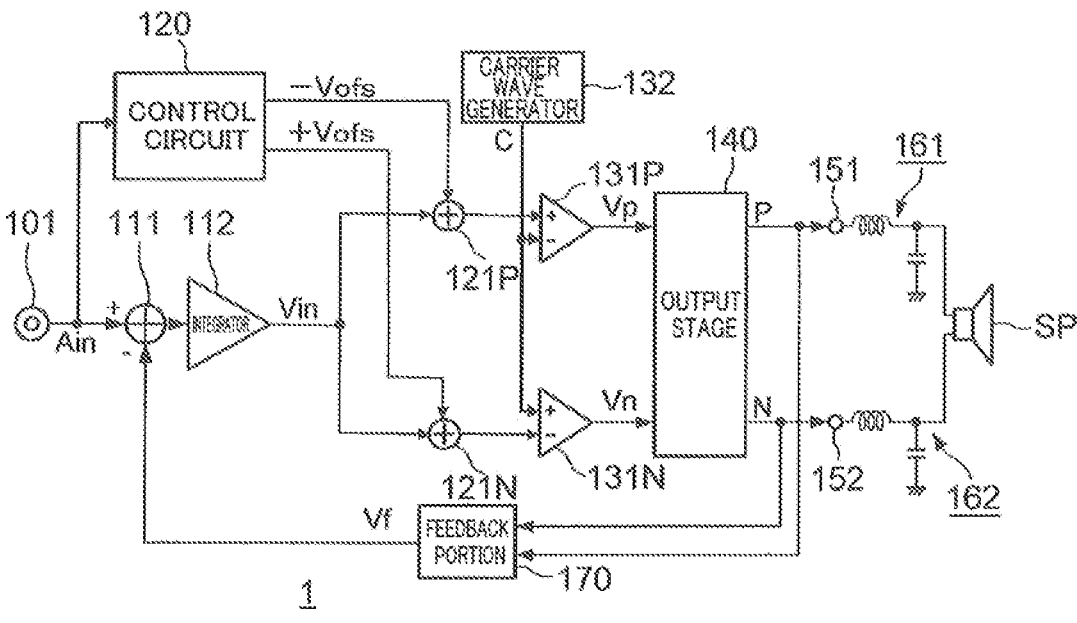
FIG. 1 is a block diagram illustrating a configuration of a class-D amplifier of an embodiment of the present disclosure.

FIG. 1 is a block diagram illustrating a configuration of a class-D amplifier 1 of an embodiment of the present disclosure. A positive side input of a speaker SP is connected to a first output terminal 151 of the class-D amplifier 1 via a LC filter 161, and a negative side input of the speaker SP is connected to a second output terminal 152 of the class-D amplifier 1 via a LC filter 162. The LC filter 161 and the LC filter 162 has a function of removing a high-frequency component from pulses outputted from the first output terminal 151 and the second output terminal 152. The speaker SP is an example of a load, and the speaker SP may be another load such as a motor or a light-emitting element.

In FIG. 1, a first stage amplifier includes an operation portion 111I and an integrator 112. The operation portion 111 subtracts a feedback signal Vf, which is outputted from a feedback portion 170, from an input signal Ain inputted via an input terminal 101, and the operation portion 111 outputs a signal indicating a result of the subtraction. The integrator 112 outputs a signal by integrating the output signal of the operation portion 111. As described above, the first stage amplifier has a larger gain with lower frequency range, and the output of the class-D amplifier 1 is given to the input of the first stage amplifier as a negative feedback. The output signal of the first stage amplifier is given to each of an adding portion 121P and an adding portion 121N as an input signal Vin. The input signal Vin is a signal obtained by correcting the input signal Ain based on the feedback signal Vf, and the input signal Vim varies so as to follow the input signal Ain. A control circuit 120 outputs a negative offset voltage-Vofs and a positive offset voltage+Vofs each as a control signal. In accordance with the signal level of the input signal Ain, an absolute value of each of the negative offset voltage–Vofs and the positive offset voltage+Vofs becomes smaller as the signal level of the input signal Ain becomes larger. The signal level is a level indicating intensity of the signal, and the signal level is extracted as, for example, an envelope of an amplitude of the signal or a peak level of the signal, and so on. More specifically, in the present embodiment, an absolute value of each of the negative offset voltage–Vofs and the positive offset voltage+Vofs, each as the control signal, becomes small by following rise of the signal level of the input signal Ain without delay, and the absolute value of each of the negative offset voltage –Vofs and the positive offset voltage+Vofs becomes large gradually by following fall of the signal level of the input signal Ain with a predetermined time constant. The adding portion 121P outputs, to a first pulse generator 131P, the signal Vin-Vofs obtained by adding the negative offset voltage –Vofs to the input signal Vin. The adding portion 121N outputs, to a second pulse generator 131N, the signal Vin+Vofs obtained by adding the positive offset voltage+ Vofs to the input signal Vin. It is noted that the adding corresponds to a voltage shift. That is, the signal Vin-Vofs is a signal obtained by shifting the original input signal Vim to a lower side by a magnitude of the control signal Vofs, and the signal Vin+Vofs is a signal obtained by shifting the original input signal Vin to an upper side by the magnitude of the control signal Vofs.

A carrier wave generator 132 is a circuit configured to generate a periodic carrier wave C. In the present embodiment, the carrier wave C is a triangular wave including a segment in which a wave rises from a negative peak value –Vin to a positive peak value+Vin in each period and a segment in which a wave falls from the positive peak value+Vin to the negative peak value-Vin.

Each of the first pulse generator 131P and the second pulse generator 131N is constituted by comparators. The carrier wave C generated by the carrier wave generator 132 is outputted to each of the first pulse generator 131P and the second pulse generator 131N. The first pulse generator 131P compares the signal Vin-Vofs outputted from the adding portion 121P and the carrier wave C, and outputs a first pulse Vp that becomes ON state (high level) in a period in which the signal Vin-Vofs is larger than the carrier wave C and OFF state (low level) in a period other than the ON state. Here, the signal Vin is a signal obtained by amplifying the input signal Ain by the first stage amplifier. Accordingly, it can be said that the first pulse generator 131P outputs the first pulse Vp based on the carrier wave C, the control signal –Vofs and the signal Vim. The first pulse generator 131P corresponds to a first generating circuit configured to generate the first pulse Vp, and a pulse width in each period of the first pulse Vp becomes narrower (the duty ratio becomes smaller) as the control signal—Vofs becomes smaller, and the pulse width in each period of the first pulse Vp becomes wider (the duty ratio becomes larger) as the instantaneous magnitude of the input signal Vin becomes larger. Moreover, the second pulse generator 131N compares the signal Vin+Vofs outputted from the adding portion 121N and the carrier wave C, and outputs a second pulse Vn that becomes ON state (high level) in a period in which the signal Vin+Vofs is smaller than the carrier wave C and OFF state (low level) in a period other than the ON state. Accordingly, it can be said that the second pulse generator 131N outputs the second pulse Vn based on the carrier wave C, the control signal+Vofs and the signal Vin. The second pulse generator 131N corresponds to a second generating circuit configured to generate the second pulse Vn, and a pulse width in each period of the second pulse Vn becomes narrower (the duty ratio becomes smaller) as the control signal+Vofs becomes larger, and the pulse width in each period of the second pulse Vn becomes wider (the duty ratio becomes larger) as the instantaneous magnitude of the input signal Vin becomes smaller. Here, "the signal is large" indicates that the voltage of the signal is large, and "the signal is small" indicates that the voltage of the signal is small.

An output stage 140 amplifies the first pulse Vp and the second pulse Vn, and outputs a first pulse P and a second pulse N to the first output terminal 151 and the second output terminal 152. In the present embodiment, the speaker SP, as the load, is connected between the first output terminal 151 and the second output terminal 152 of the output stage 140 by BLT (Bridge Tied Load). When a high level signal of the first pulse P is outputted from the first output terminal 151, a current flowing from the first output terminal 151 toward the second output terminal 152 flows through the load by the first pulse P. Moreover, when a high level signal of the second pulse N is outputted from the second output terminal 152, a current flowing from the second output terminal 152 toward the first output terminal 151 flows through the load by the second pulse N. According to this, focusing on the effect with respect to the load, the first pulse P and the second pulse N are opposite polarity. That is, a combined pulse P-N obtained by combining the first pulse P and a pulse having a phase reverse to the second pulse N is given to the load. The feedback portion 170 generates the above described feedback signal Vf by removing the high frequency component from the first pulse P and the second pulse N. and supplies the feedback signal Vf to the operation portion 111. A waveform Vsp of the signal given to the speaker SP by an execution of feedback of the feedback signal Vf becomes the same waveform as the input signal Ain.

Figure 2:
FIG. 2 is a block diagram illustrating a configuration of a control circuit of the class-D amplifier.

FIG. 2 is a block diagram illustrating a configuration of the control circuit 120. In the control circuit 120, a full-wave rectifier 122 outputs the input signal Ain in a state in which the input signal Ain is full-wave-rectified. An envelope follower 123 outputs a level signal Venv that rises by following a peak value of the output signal of the full-wave rectifier 122 without delay in a period in which the peak value of the output signal of the full-wave rectifier 122 rises and outputs the level signal Venv that falls by following the peak value of the output signal of the full-wave rectifier 122 with a predetermined time constant in a period in which the peak value of the output signal of the full-wave rectifier 122 falls. The level signal Venv indicates a signal level of the input signal Ain. A level adjuster 124 is a circuit configured to generate the negative offset voltage –Vofs and the positive offset voltage+Vofs, each as the control signal, based on the level signal Venv from the envelope follower 123, and an absolute value of each of the negative offset voltage −Vofs and the positive offset voltage+Vofs becomes smaller as the level signal Venv becomes larger. That is, the control circuit 120 is a circuit configured to generate the negative offset voltage −Vofs and the positive offset voltage+Vofs, each as the control signal, an absolute value of each of which becomes smaller as the signal level of the input signal Ain becomes larger. More specifically, the level adjuster 124 outputs the positive offset voltage+Vofs obtained by subtracting a value corresponding to the level signal Venv and a predetermined margin from a value+Vm corresponding to the positive peak value of the carrier wave C, and outputs the negative offset voltage—Vofs obtained by reversing the polarity of the positive offset voltage+Vofs. Here, the positive offset voltage+Vofs becomes zero in a case where a subtraction result becomes negative, and the positive offset voltage+Vofs does not becomes a negative value. Moreover, the way of determining the margin voltage may be arbitrary. Moreover, the margin voltage may be a constant value, and the margin voltage may be changed in accordance with the level signal Venv. That is, the positive offset voltage+Vofs and the negative offset voltage −Vofs may be changed in a curved manner with respect to the change of the level signal Venv.

Figure 3:
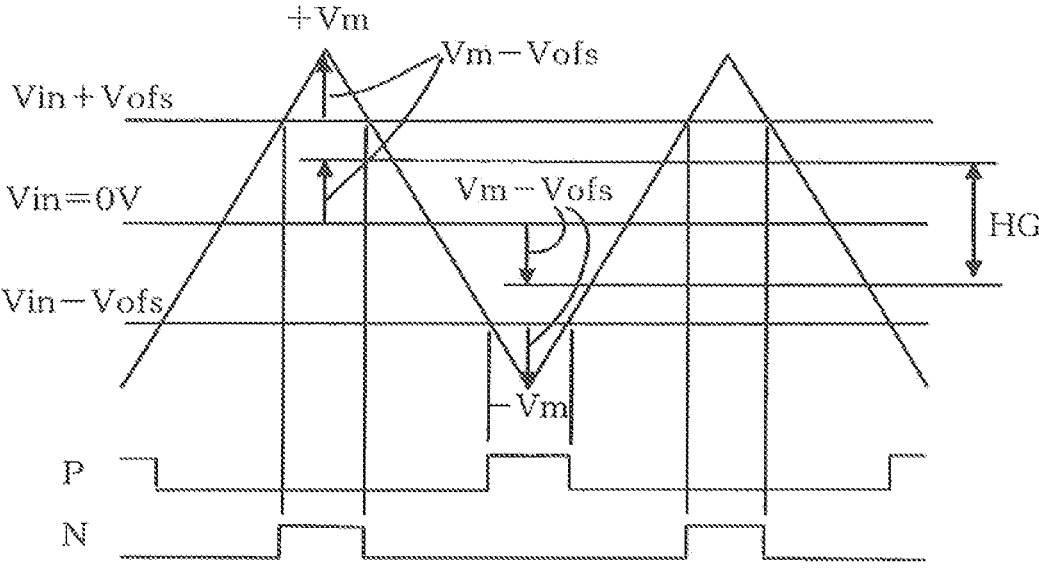
FIG. 3 is a waveform chart illustrating operations in a first pulse generator and a second pulse generator of the class-D amplifier.

Next, there will be described operations of the present embodiment. FIG. 3 is a waveform chart illustrating operations of the first pulse generator 131P and the second pulse generator 131N. As described above, the first pulse generator 131P compares the signal Vm−Vofs and the carrier wave C, and outputs the first pulse Vp that becomes ON state (high level) in a period in which the signal Vm−Vofs is larger than the carrier wave C. Moreover, the second pulse generator 131N compares the signal Vm+Vofs and the carrier wave C, and outputs the second pulse Vn that becomes ON state (high level) in a period in which the signal Vm+Vofs is smaller than the carrier wave C. Accordingly, a pulse width of the first pulse Vp becomes wider in accordance with the variation of the input signal Vm in the positive direction, and the pulse width of the first pulse Vp becomes narrower in accordance with the variation of the control signal Vofs in the positive direction. Moreover, a pulse width of the second pulse P becomes wider in accordance with the variation of the input signal Vm in the negative direction, and the pulse width of the second pulse P becomes narrower in accordance with the variation of the control signal Vofs in the positive direction. The first pulse Vp and the second pulse Vu are amplified at the output stage 140, and are outputted as the first pulse P and the second pulse N.

Next, there will be described an area of the input signal Vii in which the first pulse P is outputted and an area of the input signal Vm in which the second pulse N is outputted. Suppose that the input signal Vm=0V. In this case, there is a margin Vm−Vofs between a negative peak −Vm of the carrier wave C and the signal Vm−Vofs. And, in a case where the input signal Vm is changed from 0V in the negative direction by the magnitude of the margin Vm−Vofs, the pulse width of the first pulse P becomes zero. That is, the lower limit of the area of the input signal Vm in which the first pulse P is outputted becomes 0V−(Vm−Vofs). On the other hand, there is the margin Vm−Vofs between the positive peak+Vm of the carrier wave C and the signal Vm+Vofs. And, in a case where the input signal Vm is varied from 0V in the positive direction by the margin Vm−Vofs, the pulse width of the second pulse N becomes zero. That is, the upper limit of the area of the input signal Vm in which the second pulse N is outputted becomes 0V+(Vm−Vofs). Accordingly, an area, of an area in which the input signal Vm varies, in which both the first pulse Vp and the second pulse Vn are outputted is an area from—Vm+Vofs to +Vm−Vofs, that is, a high-gain area HG.

In the present embodiment, the control circuit 120 controls the high-gain area HG by changing the offset voltage −Vofs and the offset voltage+Vofs, each as the control signal, based on the input signal Ain and causes the class-D amplifier 1 to always operate in the high-gain area HG.

Figure 4:
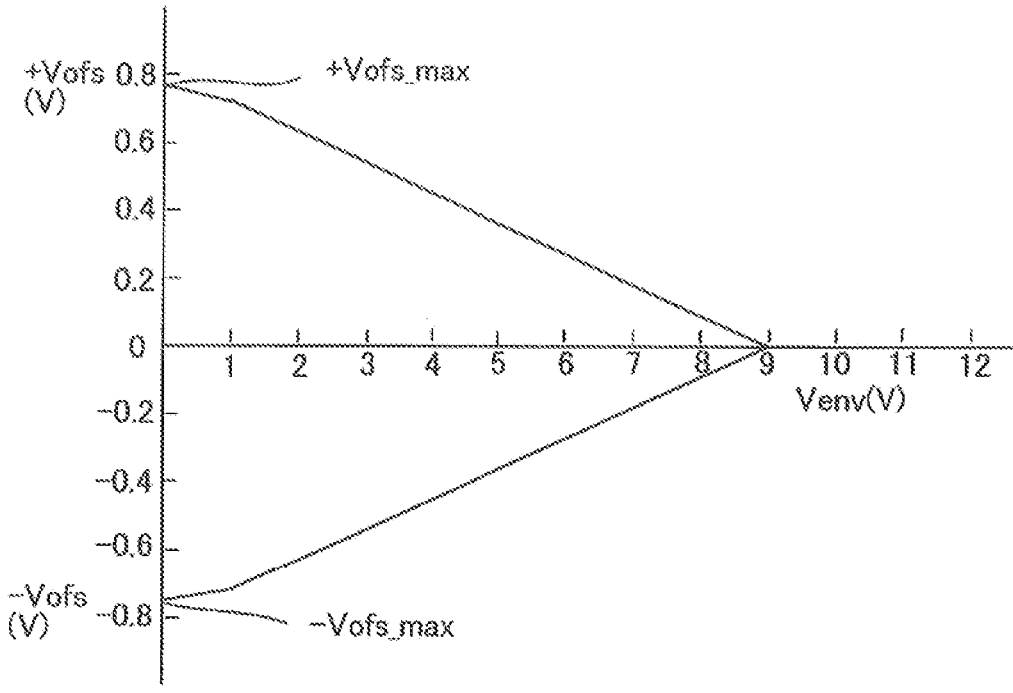
FIG. 4 is a view illustrating an example of input-output characteristics of a level adjuster of the control circuit.

FIG. 4 is a view illustrating an example of input-output characteristics of the level adjuster 124 in the control circuit 120. In FIG. 4, the horizontal axis indicates the output voltage Venv of the envelope follower 123, and the vertical axis indicates the offset voltage—Vofs or the offset voltage+ Vofs.

In the present embodiment, in a case where the instantaneous magnitude of the input signal Vm which is given to the adding portion 121P and the adding portion 121N remains in the area between the lower limit value—Vm+ Vofs and the upper limit value+Vm−Vofs, the class-D amplifier 1 operates in the high-gain area HG. Accordingly, it is necessary to make the offset voltage Vofs (the absolute value) smaller value than the value obtained by subtracting the signal level of the input signal Vm from the peak value+Vm of the carrier wave C so as to cause the class-D amplifier 1 to operate in the high-gain area HG. Then, in the present embodiment, the level adjuster 124 generates the positive offset voltage+Vofs (and the negative offset voltage −Vofs) based on the value obtained by subtracting the voltage corresponding to the level signal Venv and further subtracting the predetermined margin voltage from the positive peak value+Vm of the carrier wave C.

In a case where the signal level of the input signal Ain is under no signal state and the output voltage Venv of the envelope follower 123 is 0V, the absolute value (the offset voltage Vofs) of each of the positive offset voltage+Vofs and the negative offset voltage −Vofs becomes a predetermined maximum value Vofs_max. The maximum value Vofs_max is a voltage obtained by subtracting a predetermined margin from the peak value+Vm of the carrier wave C (for example, 0.9V), and the maximum value Vofs_max in FIG. 4 is, for example, about 0.76V.

In a case where the signal level of the input signal Ain increases and the output voltage Venv of the envelope follower 123 increases, as illustrated in FIG. 4, the positive offset voltage+Vofs comes close to 0V with respect to increasing of the output voltage Venv so as to almost linearly decrease, and the negative offset voltage −Vofs comes close to 0V so as to almost linearly increase. And, in the example illustrated in FIG. 4, when the output voltage Venv becomes a transition voltage (for example, 9V), each of the positive offset voltage+Vofs and the negative offset voltage—Vofs reaches 0V. 9V of the transition voltage in the present example is determined based on a maximum value Am (an absolute value) of the input signal Ain obtained when the signal Vm outputted from the integrator 112 becomes the positive peak value+Vm=0.9V or the negative peak value −Vm=−0.9V of the carrier wave C. Accordingly, in the example illustrated in FIG. 4, in a case where the input signal Ain (for example, the absolute value of which is 9V) obtained by subtracting the margin voltage from the maximum value Am is given, each of the positive offset voltage+ Vofs and the negative offset voltage −Vofs becomes 0V. Further, the value of the transition voltage may be determined based on the voltage Vm (an absolute value), the margin voltage, an open-loop gain of the class-D amplifier 1 (Vsp/Ain), and again after the output of the integrator (Vsp/Vm). Moreover, the input-output characteristics illustrated in FIG. 4 may be determined based on the voltage Vm (an absolute value) and the determined transition voltage.

Figure 5:
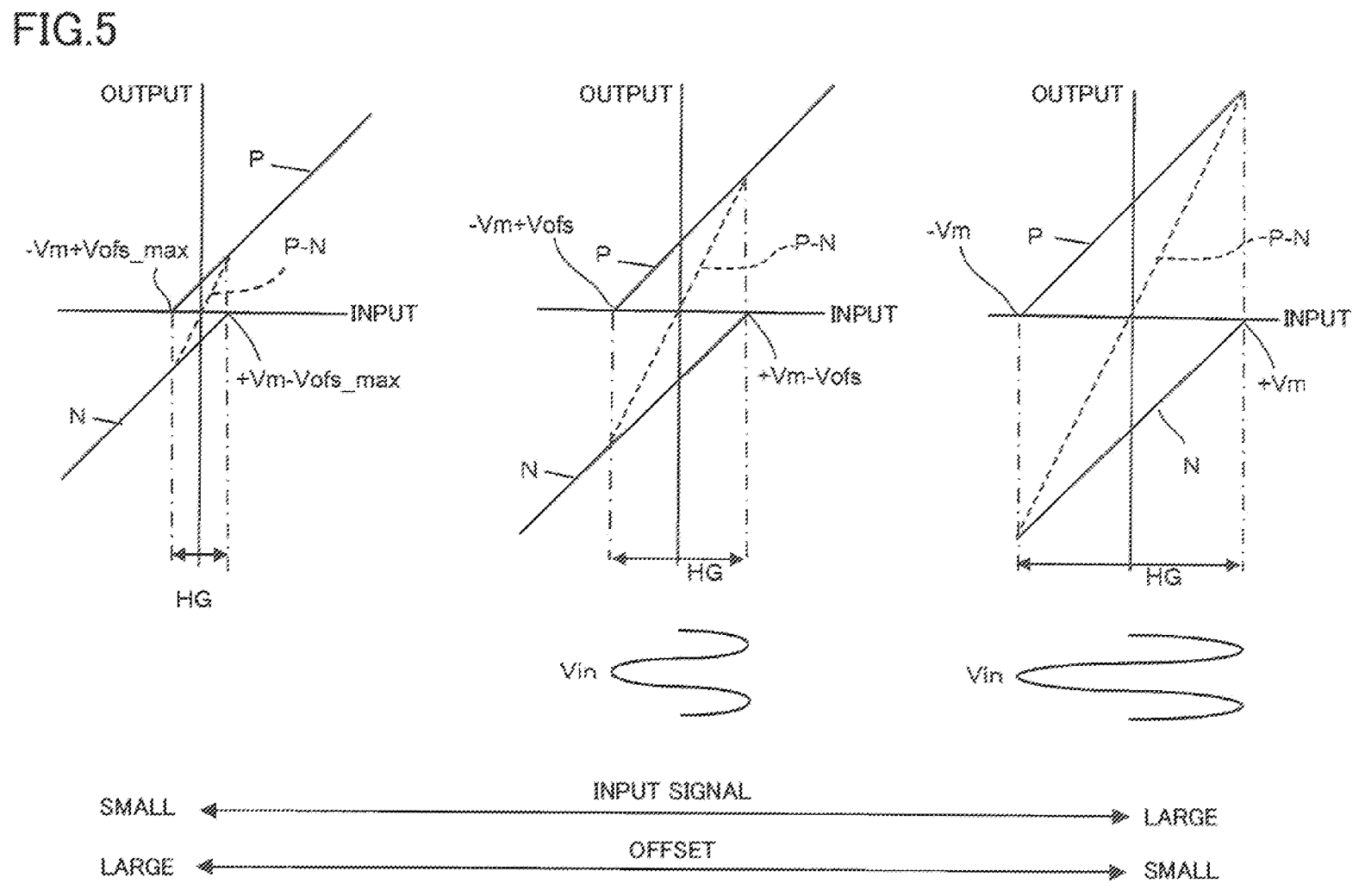

FIG. 5 is a diagram illustrating operations of the class-D amplifier 1 performed under the above described control by the control circuit 120. An upper side of FIG. 5 indicates diagrams each illustrating the input-output characteristics of the class-D amplifier 1 in a state in which the signal level of the input signal Ain is changed. In the diagrams, the horizontal axis indicates the signal Vm, and the vertical axis indicates a width of pulse of each of the first pulse P, the second pulse N or the combined pulse P-N obtained by combining the first pulse P and the second pulse N.

First, there will be described operations of the class-D amplifier 1 performed when the input signal Ain gradually rises from the signal level in the no-signal state. In a state in which the signal level of the input signal Ain is nearly zero (in the no-signal state), the output voltage Venv which is given to the level adjuster 124 becomes 0V, and, as described above, the positive offset voltage+Vofs becomes a maximun value+Vofs_max, and the negative offset voltage—Vofs becomes−Vofs_max which is obtained by reversing the polarity of the maximum value+Vofs. As a result of this, the lower limit of the area of the input signal Vm in which the first pulse P is outputted becomes −Vm+Vofs_max, and the upper limit of the area of the input signal Vm in which the second pulse N is outputted becomes+Vm−Vofs_max. Accordingly, the input-output characteristics of the class-D amplifier 1 become a graph illustrated in a left part of the upper side in FIG. 5.

As described above, in the state in which the input signal Ain is in the no-signal state or nearly in the no-signal state, each of the lower limit and the upper limit of the high-gain area HG becomes a value that comes close to 0V and a width of the high-gain area HG becomes a minimum value when the offset voltage Vofs, as the control signal, becomes the maximum value (+Vofs_max). And, the input signal is in the no-signal state, since the input signal Vm given to the adding portion 121P and the adding portion 121N becomes nearly 0V, the input signal given to the first pulse generator 131P becomes Vm−Vofs=−Vofs_max, and the input signal give to the second pulse generator 131N becomes Vm+Vofs=+Vofs_max. Accordingly, in the example illustrated in the left part of the upper side in FIG. 5, the duty ratio of each of the first pulse P and the second pulse N becomes about 10%. As a result, according to the present embodiment, it is possible to reduce power consumption of the class-D amplifier 1 in the no-signal state.

In a state in which the signal level of the input signal Ain somewhat increases and the signal level of the input signal Ain is half of the maximun value Am, the input-output characteristics of the class-D amplifier 1 becomes a graph illustrated in a central part of the upper side in FIG. 5.

Here, the width of the high-gain area HG becomes wider gradually as the signal level of the input signal Ain increases. More specifically, when the signal level of the input signal Ain increases and the output voltage Venv given to the level adjuster 124 increases, the offset voltage Vofs that determines the lower limit −Vm+Vofs and the upper limit+Vm−Vofs of the high-gain area HG is decreased so that the signal Vm remains within the high-gain area HG. Accordingly, the signal Vm always remains within the high-gain area HG in a course in which the signal level of the input signal Ain increases, and the class-D amplifier 1 always operates within the high-gain area HG. Accordingly, according to the present embodiment, it is possible to suppress deterioration of a total harmonics distortion rate.

When the signal level of the input signal Ain further increases and the output voltage Venv given to the level adjuster 124 reaches the transition voltage (9V in the example illustrated in FIG. 4), each of the positive offset voltage+Vofs and the negative offset voltage—Vofs becomes 0V. As a result of this, the lower limit of the area of the input signal Vm in which the first pulse P is outputted becomes −Vm+Vofs=−Vm+0V=−Vm, and the upper limit of the area of the input signal Vm in which the second pulse Vn is outputted becomes+Vm−Vofs=+Vm. Accordingly, the input-output characteristics of the class-D amplifier 1 become a graph illustrated in a right part of the upper side in FIG. 5. In this case, the duty ratio of each of the first pulse P and the second pulse N when the instantaneous magnitude of the input signal Vm is zero becomes 50%.

When the signal level of the input signal Ain further increases and the output voltage Venv given to the level adjuster 124 becomes larger than the transition voltage, each of the positive offset voltage+Vofs and the negative offset voltage—Vofs keeps at 0V. In this case, the input-output characteristics of the class-D amplifier 1 become the graph illustrated in the right part of the upper side in FIG. 5, and, when the signal level of the input signal Ain becomes larger than the maximum value Am, each of the first pulse generator 131P and the second pulse generator 131N is in a clipped state in which the output of each of the first pulse generator 131P and the second pulse generator 131N is clipped. The operations in the clipped state are the same operations as the normal class-D amplifier.

Next, there will be described operations of the class-D amplifier 1 performed in a state in which the signal level of the input signal Ain gradually falls. In a state in which the signal level of the input signal Ain rises, it is necessary to immediately decrease the offset voltage Vofs so as to prevent the occurrence of the clipped state. However, in the state in which the signal level of the input signal Ain falls, since the clipped state does not occur, it is not necessary to immediately decrease the offset voltage Vofs. Conversely, there is a possibility that, the distortion in the output signal of the class-D amplifier 1 increases, in the case where the offset voltage Vofs is immediately decreased and a frequency of variation of the offset voltage Vofs is increased. Accordingly, since the envelope follower 123 is provided in the control circuit 120 of the present embodiment, the offset voltage Vofs, as the control signal, decreases so as to follow the rise of the signal level of the input signal Ain without delay, and gradually increases so as to follow the fall of the signal level of the input signal Ain with the predetermined time constant. In a case where the class-D amplifier 1 is applied to acoustic signals, the time constant between 10 seconds to 30 seconds are applicable. That is, in the case where the signal level of the input signal Ain falls, the input-output characteristics of the class-D amplifier 1 gradually shift from the graph illustrated in the right part of the upper side in FIG. 5 to the graph illustrated in the central part of the upper side in FIG. 5, further from the graph illustrated in the central part of the upper side in FIG. 5 to the graph illustrated in the left part of the upper side in FIG. 5. Accordingly, according to the present embodiment, it is possible to avoid the situation in which the distortion increases due to increase of the frequency of the variation of the offset voltage Vofs.

As described above, according to the present embodiment, in the class-D amplifier 1, it is possible to suppress deterioration of the total harmonics distortion rate and reduce power consumption in a small-signal area.

As described above, there has been the embodiment of the present disclosure, however, the present disclosure includes other embodiments. For example, the following embodiments may be applicable.

The present disclosure is applicable to a broad range of class-D amplifiers such as a high-power class-D amplifier, the power of which is larger than 100 W or a low-power class-D amplifier installed on a mobile phone. In the low-power class-D amplifier, the LC filter 161 and the LC filter 162 may be eliminated.

In the present embodiment, the first pulse generator 131P generates the pulse by comparing the signal obtained by adding the negative offset voltage to the input signal and the carrier wave, and the second pulse generator 131N generates the pulse by comparing the signal obtained by adding the positive offset voltage to the input signal and the carrier wave. Alternatively, the first pulse generator 131P may generate the pulse by comparing the input signal and the signal obtained by adding the positive offset voltage to the carrier wave, and the second pulse generator 131N may generate the pulse by comparing the input signal and the signal obtained by adding the negative offset voltage to the carrier wave. That is, the first pulse generator 131P may generate the first pulse Vp by comparing the input signal Vm and the carrier wave C+Vofs obtained by shifting the original carrier wave C by the magnitude of the control signal, and the second pulse generator 131N may generate the second pulse Vn by comparing the input signal Vm and the carrier wave C—Vofs obtained by shifting the original carrier wave C by the magnitude of the control signal. Alternatively, the first pulse generator 131P and the second pulse generator 131N may generate the pulse by comparing (i) each of the signals obtained by adding the positive or negative offset signal and the carrier wave to the input signal and (ii) a predetermined threshold.

In the above described embodiment, the triangle wave is used as the carrier wave, however, a saw-tooth wave may be used.

What is claimed is:

1. A class-D amplifier that amplifies an input signal, comprising:

a control circuit configured to generate a control signal that varies in accordance with a level of the input signal;

a first generating circuit configured to generate a first pulse, a pulse width of the first pulse becoming narrower in accordance with the control signal as a signal level of the input signal becomes smaller, the pulse width of the first pulse becoming wider in accordance with the control signal as an instantaneous magnitude of the input signal becomes larger; and a second generating circuit configured to generate a second pulse, a pulse width of the second pulse becoming narrower in accordance with the control signal as a signal level of the input signal becomes smaller, the pulse width of the second pulse becoming wider in accordance with the control signal as an instantaneous magnitude of the input signal becomes smaller, wherein a high-gain area in which the first generating circuit generates the first pulse and the second generating circuit generates the second pulse, in an area in which the input signal varies, becomes wider in accordance with the control signal as the signal level of the input signal becomes larger.

2. The class-D amplifier according to claim 1, wherein the high-gain area has a predetermined margin with respect to the signal level of the input signal.

3. The class-D amplifier according to claim 1, further comprising an output stage configured to amplify the first pulse and supply the amplified first pulse to a positive side input of a load, the output stage being configured to amplify the second pulse and supply the amplified second pulse to a negative side input of the load.

4. The class-D amplifier according to claim 1, further comprising a carrier-wave generator configured to generate a carrier wave and output the carrier wave to the first generating circuit and the second generating circuit, wherein the first generating circuit and the second generating circuit are configured to respectively generate the first pulse and the second pulse based on (i) the carrier wave generated by the carrier-wave generator, (ii) the control signal generated by the control circuit, and (iii) an amplified input signal obtained by amplifying the input signal by a first stage amplifier.

5. A class-D amplifier that amplifies an input signal, comprising:

a control circuit configured to generate a control signal that varies in accordance with a level of the input signal;

a first generating circuit configured to generate a first pulse, a pulse width of the first pulse becoming narrower in accordance with the control signal as a signal level of the input signal becomes smaller, the pulse width of the first pulse becoming wider in accordance with the control signal as an instantaneous magnitude of the input signal becomes larger; and a second generating circuit configured to generate a second pulse, a pulse width of the second pulse becoming narrower in accordance with the control signal as a signal level of the input signal becomes smaller, the pulse width of the second pulse becoming wider in accordance with the control signal as an instantaneous magnitude of the input signal becomes smaller, wherein the control circuit is configured to vary the control signal so as to follow rise of the signal level of the input signal without delay and follow fall of the signal level of the input signal with a predetermined time constant.

6. The class-D amplifier according to claim 5, the control circuit further comprising an envelope-follower configured to generate a level signal that rises so as to follow an absolute value of the input signal without delay while the absolute value higher than the level signal rises and falls so as to follow the absolute value of the input signal with a predetermined time constant while the absolute value lower than the level signal falls, wherein the control circuit is configured to generate the control signal based on the level signal.

7. The class-D amplifier according to claim 5, further comprising an output stage configured to amplify the first pulse and supply the amplified first pulse to a positive side input of a load, the output stage being configured to amplify the second pulse and supply the amplified second pulse to a negative side input of the load.

8. The class-D amplifier according to claim 5, further comprising a carrier-wave generator configured to generate a carrier wave and output the carrier wave to the first generating circuit and the second generating circuit, wherein the first generating circuit and the second generating circuit are configured to respectively generate the first pulse and the second pulse based on (i) the carrier wave generated by the carrier-wave generator, (ii) the control signal generated by the control circuit, and (iii) an amplified input signal obtained by amplifying the input signal by a first stage amplifier.

9. A class-D amplifier that amplifies an input signal, comprising:

a control circuit configured to generate a control signal that varies in accordance with a level of the input signal;

a first generating circuit configured to generate a first pulse, a pulse width of the first pulse becoming narrower in accordance with the control signal as a signal level of the input signal becomes smaller, the pulse width of the first pulse becoming wider in accordance with the control signal as an instantaneous magnitude of the input signal becomes larger; and a second generating circuit configured to generate a second pulse, a pulse width of the second pulse becoming narrower in accordance with the control signal as a signal level of the input signal becomes smaller, the pulse width of the second pulse becoming wider in accordance with the control signal as an instantaneous magnitude of the input signal becomes smaller, wherein the control signal generated by the control circuit becomes smaller as the signal level of the input signal becomes larger.

10. The class-D amplifier according to claim 9, further comprising an output stage configured to amplify the first pulse and supply the amplified first pulse to a positive side input of a load, the output stage being configured to amplify the second pulse and supply the amplified second pulse to a negative side input of the load.

11. The class-D amplifier according to claim 9, further comprising a carrier-wave generator configured to generate a carrier wave and output the carrier wave to the first generating circuit and the second generating circuit, wherein the first generating circuit and the second generating circuit are configured to respectively generate the first pulse and the second pulse based on (i) the carrier wave generated by the carrier-wave generator, (ii) the control signal generated by the control circuit, and (iii) an amplified input signal obtained by amplifying the input signal by a first stage amplifier.

12. The class-D amplifier according to claim 9, wherein the first generating circuit is configured to generate the first pulse by comparing (i) the amplified input signal shifted upward from the original amplified input signal by a level of the control signal and (ii) the carrier wave, and wherein the second generating circuit is configured to generate the second pulse by comparing (i) the carrier wave and (ii) the amplified input signal shifted downward from the original amplified input signal by the level of the control signal.

13. The class-D amplifier according to claim 9, wherein the first generating circuit is configured to generate the first pulse by comparing (i) the amplified input signal and (ii) the carrier wave shifted upward from the original carrier wave by a level of the control signal, and wherein the second generating circuit is configured to generate the second pulse by comparing (i) the carrier wave shifted downward from the original carrier wave by the level of the control signal and (ii) the amplified input signal.

* * * * *